United States Patent
Takikawa et al.

(10) Patent No.: US 10,692,640 B2
(45) Date of Patent: Jun. 23, 2020

(54) NON-CONTACT POWER FEEDING COIL AND NON-CONTACT POWER FEEDING SYSTEM

(71) Applicant: FUJI CORPORATION, Chiryu-shi (JP)

(72) Inventors: Shinji Takikawa, Nagoya (JP); Takeshi Nomura, Chiryu (JP)

(73) Assignee: FUJI CORPORATION, Chiryu-shi (JP)

( * ) Notice: Subject to any disclaimer, the term of this patent is extended or adjusted under 35 U.S.C. 154(b) by 114 days.

(21) Appl. No.: 15/762,376

(22) PCT Filed: Sep. 24, 2015

(86) PCT No.: PCT/JP2015/076963
§ 371 (c)(1),
(2) Date: Mar. 22, 2018

(87) PCT Pub. No.: WO2017/051460
PCT Pub. Date: Mar. 30, 2017

(65) Prior Publication Data
US 2018/0277294 A1    Sep. 27, 2018

(51) Int. Cl.
*H02J 7/00* (2006.01)
*H01F 27/24* (2006.01)
(Continued)

(52) U.S. Cl.
CPC .............. *H01F 27/24* (2013.01); *B60L 53/12* (2019.02); *B60L 53/39* (2019.02); *H01F 27/255* (2013.01);
(Continued)

(58) Field of Classification Search
CPC ...... H01F 38/14; H01F 27/24; H01F 27/2823; H01F 27/28; H01F 27/32; H01F 27/2871;
(Continued)

(56) References Cited

U.S. PATENT DOCUMENTS

2008/0129246 A1* 6/2008 Morita ................... B60L 5/005
320/108
2011/0050382 A1   3/2011 Baarman et al.
(Continued)

FOREIGN PATENT DOCUMENTS

JP    8-149723 A    6/1996
JP    3462772 B2    1/2004
(Continued)

OTHER PUBLICATIONS

International Search Report dated Dec. 15, 2015, in PCT/JP2015/076963 filed Sep. 24, 2015.

*Primary Examiner* — Alfonso Perez Borroto
*Assistant Examiner* — Esayas G Yeshaw
(74) *Attorney, Agent, or Firm* — Oblon, McClelland, Maier & Neustadt, L.L.P.

(57) ABSTRACT

A non-contact power feeding coil provided with a coil; and a core that forms a part of a circulating magnetic path that is interlinked to the coil, and used in at least one of a power feeding-side device and a power receiving-side device of a non-contact power feeding system, in which the core is configured to connect three or more core units in one row, and the core units include one or more interlinked core units that are interlinked to the coil and two non-interlinked core units that are not interlinked to the coil respectively disposed on both ends in the connection direction of the one or more interlinked core units. Thereby, it is possible to provide a non-contact power feeding coil that suppresses an increase in leakage flux.

8 Claims, 3 Drawing Sheets

(51) Int. Cl.

| | | |
|---|---|---|
| *H01F 38/14* | (2006.01) | |
| *H01F 27/255* | (2006.01) | |
| *H01F 27/28* | (2006.01) | |
| *B60L 53/12* | (2019.01) | |
| *B60L 53/39* | (2019.01) | |
| *H02J 50/10* | (2016.01) | |
| *H02J 50/40* | (2016.01) | |
| *H02J 50/70* | (2016.01) | |
| *H01F 27/32* | (2006.01) | |
| *H05K 13/00* | (2006.01) | |

(52) U.S. Cl.
CPC ......... *H01F 27/28* (2013.01); *H01F 27/2823* (2013.01); *H01F 27/2871* (2013.01); *H01F 27/32* (2013.01); *H01F 38/14* (2013.01); *H02J 50/10* (2016.02); *H02J 50/40* (2016.02); *H02J 50/70* (2016.02); *H05K 13/00* (2013.01)

(58) Field of Classification Search
CPC ......... H01F 27/255; H02J 50/70; H02J 50/10; H02J 50/40; B60L 53/39; B60L 53/12; H05K 13/00
See application file for complete search history.

(56) References Cited

U.S. PATENT DOCUMENTS

| | | | |
|---|---|---|---|
| 2012/0032632 A1* | 2/2012 | Soar | H01F 38/14 320/108 |
| 2014/0035379 A1* | 2/2014 | Stevens | H02J 7/0013 307/104 |
| 2014/0312702 A1* | 10/2014 | Uchida | H02J 17/00 307/80 |
| 2015/0224883 A1* | 8/2015 | Ichikawa | B60L 50/40 320/108 |
| 2016/0118836 A1* | 4/2016 | Waldschmidt | H02J 7/025 320/108 |
| 2017/0274779 A1* | 9/2017 | Cho | H02J 50/10 |
| 2018/0062430 A1* | 3/2018 | Matsumoto | H02J 7/00 |

FOREIGN PATENT DOCUMENTS

| | | |
|---|---|---|
| JP | 2008-120239 A | 5/2008 |
| JP | 2010-172084 A | 8/2010 |
| JP | 2011-100819 A | 5/2011 |
| JP | 2011-167031 A | 8/2011 |
| JP | 2013-62924 A | 4/2013 |
| JP | 2013-115890 A | 6/2013 |
| JP | 5255881 B2 | 8/2013 |
| JP | 2014-96982 A | 5/2014 |

* cited by examiner

NON-CONTACT POWER FEEDING COIL AND NON-CONTACT POWER FEEDING SYSTEM

TECHNICAL FIELD

The present application relates to a non-contact power feeding coil provided with a coil and a core, and a non-contact power feeding system configured using the non-contact power feeding coil.

BACKGROUND ART

A solder printing machine, a component mounting machine, a reflow machine, a board inspection machine, and the like may be used as a board production machine for producing a board on which multiple components are mounted. Typically, the equipment is connected and is constituted by a board production line. Furthermore, in many cases a board production line is configured by arranging board production machines modularized at the same size. Setup changing work is easy during line recombination or during extension in which a line is lengthened by using a modularized board production machine, and a flexible board production line is realized.

In recent years, promoting labor saving and automation by machinery or members used by each board production machine of the board production line being conveyed to a moving body that moves along the board production line has been investigated. Furthermore, as power supply means to the moving body, a non-contact power feeding system is considered that sets a board production line as a power feeding-side device and sets the moving body as a power receiving-side device. Note that, application of the non-contact power feeding system is not limited to a board production line, and covers a wide range of fields including assembly lines and processing lines that produce other products, power supply during running of electric vehicles, and the like. A technical example which relates to this type of non-contact power feeding system is disclosed in PTL 1 to PTL 3.

PTL 1 discloses a pickup coil unit that generates an induced electromotive force based on current that is supplied to a feeder. The pickup coil unit forms a core around which a pickup coil is wound by joining multiple core pieces, and forms a positioning section on a joining surface of the core pieces. Then, the number of core piece joins is selected according to power feeding capacity. Thereby, it is possible to simply assemble and easily change the power feeding capacity of the pickup unit. Furthermore, the embodiment discloses using an E-type core as the core piece.

A non-contact power feeding device in PTL 2 has a similar configuration to PTL 1 and is characterized by displaceably providing a partition plate that determines a position of a coil that configures a power receiving coil. Thereby, it is possible to reduce influence of leakage flux from the end portion of a core leg section on the power receiving coil and it is possible to enhance the power receiving efficiency. Furthermore, the embodiment discloses that it is also possible to adopt a C-type core and not only an E-type core as the core.

PTL 3 discloses a non-contact power feeding device that is provided with a pickup portion that is inductively coupled to a feeder through which a high frequency current flows. The pickup portion is configured so as to be provided with a connection core and an end face core that have a cut coil, respectively, and when the connection core and the end face core are connected, the cut coils are coupled. Thereby, it is possible to simply adjust an output voltage by connecting the end face core to the end face of the connection core.

CITATION LIST

Patent Literature

PTL 1: Japanese Patent No. 3482772
PTL 2: Japanese Patent No. 5255881
PTL 3: JP-A-2013-115890

BRIEF SUMMARY

Technical Problem

Note that, in PTL 1 to PTL3, a configuration of a power feeding-side device is a feeder that extends in a movement direction, and the core is not used. Therefore, a circulating magnetic path is formed of only power receiving side cores, and power feeding efficiency reduces along with a comparative increase of leakage flux. Accordingly, it is difficult to use the non-contact power feeding techniques of PTL 1 to PTL3 in the vicinity of machinery that includes an iron structure and an electronic control device, for example, in the vicinity of a board production line. This is because there is a concern of a decrease in power feeding efficiency due to heat generation of the iron structure and there is a concern of a malfunction of the electronic control device.

In order to use the non-contact power feeding system in the vicinity of the iron structure and the electronic control device, it is preferable for both the power feeding side and the power receiving side non-contact power feeding coils to be provided with cores, the circulating magnetic path is formed facing both cores, and reducing leakage flux. However, even if both the power feeding side and the power receiving side non-contact power feeding coils are provided with cores, when the coil protrudes further than the end face of the core, leakage flux from a protruding section of the coil is raised.

In addition, in PTL 1 and PTL2, in order to reduce magnetic resistance of the circulating magnetic path that is formed of only power receiving side cores, a separation distance on a tip end of a magnetic leg section is narrowed (for example, a T-shape central protruding section 12a in PTL 1, and a leg section 24 on the tip end of an arm section 22 in PTL 2). Therefore, it is not easy to form a coil to be wound at a magnetic leg center portion entered from the tip end of the magnetic leg section. As a countermeasure, a cut coil is suggested in PTL 3, but it is hard to say that the difficulty of the manufacturing method has been eliminated.

Furthermore, in order to use the non-contact power feeding system in a product assembly line and processing line, it is not only possible to simply respond to changes in the power feeding capacity, but it is necessary for it to be possible to respond to changes in the model of assembling machines and processing machines that configure the line. For example, in the board production line, dimensions in a width direction of a board production machine differ depending on the model, additionally, distance between each of the board production machines changes according to the model configuration. Therefore, it is preferable for it to be possible to at least easily modify the size of the non-contact power feeding coil on the power feeding side.

The present invention is made in consideration of the problems of the background art, and an object thereof is to provide a non-contact power feeding coil that suppresses an increase of leakage flux, and to provide a non-contact power feeding system that obtains a favorable power feeding efficiency using the non-contact power feeding coil.

Solution to Problem

The present disclosure to solve the problems described above provides a non-contact power feeding coil provided with: a coil; and a core that forms a part of a circulating magnetic path that is interlinked to the coil, and used in at least one of a power feeding-side device and a power receiving-side device of the non-contact power feeding system, in which the core is configured to connect three or more core units in one row, and the core units include one or more interlinked core units that are interlinked to the coil and two non-interlinked core units that are not interlinked to the coil respectively disposed on both ends in a connection direction of the one or more interlinked core units.

In addition, the present disclosure provides a non-contact power feeding system using the non-contact power feeding coil of the present disclosure described above in a power feeding-side coil and a power receiving-side coil, the system provided with a plurality of the power feeding-side coils that are disposed separately from each other along a movement direction that is set in the power feeding-side device, a power supply section that supplies power to each of the power feeding-side coils, the power receiving-side coil, which is provided in the power receiving-side device that moves in the movement direction, and that receives power in a non-contact manner electromagnetically coupled with the power feeding-side coil to be disposed facing the power feeding-side coil, and a power receiving circuit that converts power that is received by the power receiving-side coil and that generates a drive voltage and outputs the drive voltage to an electric load that is provided to the power receiving-side device.

Advantageous Effects

In the non-contact power feeding coil of the present disclosure, the core is configured to connect, in one row, one or more interlinked core units that are interlinked to the coil and two non-interlinked core units that are not interlinked to the coil respectively disposed on both ends to each other. Thereby, the non-interlinked core units that are disposed on both ends in a connection direction are disposed facing the end portion of the coil. Then, the non-interlinked core units have a magnetic shield effect of a contribution to electromagnetic coupling is reduced and magnetic flux that is generated by the coil does not leak to the outside. Accordingly, it is possible to provide a non-contact power feeding coil that suppresses an increase of leakage flux.

In addition, in the non-contact power feeding system of the present disclosure, the non-contact power feeding coil of the present disclosure is used in both a power feeding-side coil and a power receiving-side coil. Thereby, when the power feeding-side coil and the power receiving-side coil are disposed to face each other, leakage flux remarkably reduces since the cores of both coils jointly form a circulating magnetic path, and electromagnetic coupling with an extremely high coupling degree is realized. Accordingly, it is possible to provide a non-contact power feeding system in which favorable power feeding efficiency is obtained.

DESCRIPTION OF EMBODIMENTS

1. Configuration of Non-contact Power Feeding Coil 1 of First Embodiment

Figure 1:
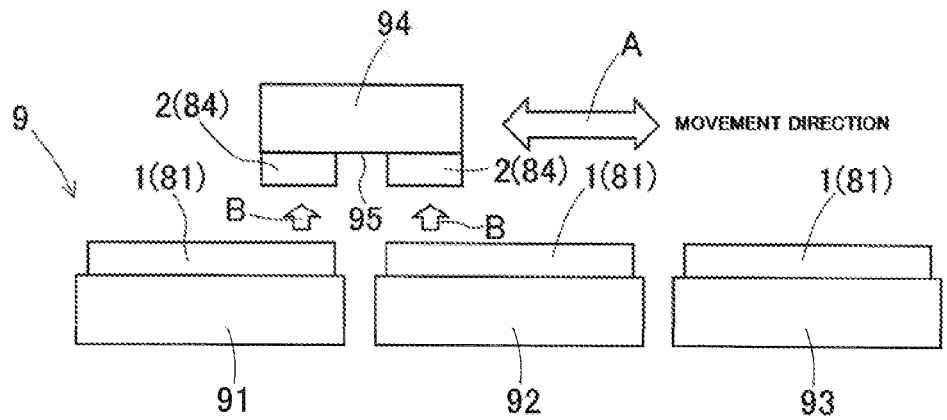
FIG. 1 is a planar view that conceptually describes a non-contact power feeding system of an embodiment.

First, a non-contact power feeding system 9 of an embodiment of the present disclosure will be conceptually described. FIG. 1 is a planar view that conceptually describes the non-contact power feeding system 9 of an embodiment. As illustrated, three fixed sections 91 to 93 are arranged as a power feeding-side device. The non-contact power feeding coils 1 of the first embodiment are respectively disposed as a power feeding-side coil 81 on the front side of each fixed section 91 to 93. The non-contact power feeding coil 1 inputs power from a power supply section 82 (illustrated in FIG. 6). The number of fixed sections 91 to 93 and non-contact power feeding coils 1 may be greater than three.

A guide rail, which is not illustrated, that extends in an arrangement direction is disposed in front of the three fixed sections 91 to 93. As indicated by arrow A in FIG. 1, a moving body 94 that is equivalent to a power receiving-side device moves along the guide rail in a movement direction (arrangement direction of the fixed sections 91 to 93). Two non-contact power feeding coils 2 of the second embodiment are disposed as the power receiving-side coil 84 on a side face 95 that faces the fixed sections 91 to 93 of the moving body 94. The non-contact power feeding coil 2 is connected to a power receiving circuit 86 (illustrated in FIG. 6) and an electric load 89 (illustrated in FIG. 6). The non-contact power feeding coil 2 switches the facing non-contact power feeding coil 1 in accordance with the movement of the moving body 94. As indicated by arrow B in FIG. 1, the non-contact power feeding coil 2 receives AC power by being electromagnetically coupled to the facing non-contact power feeding coil 1.

Figure 2:
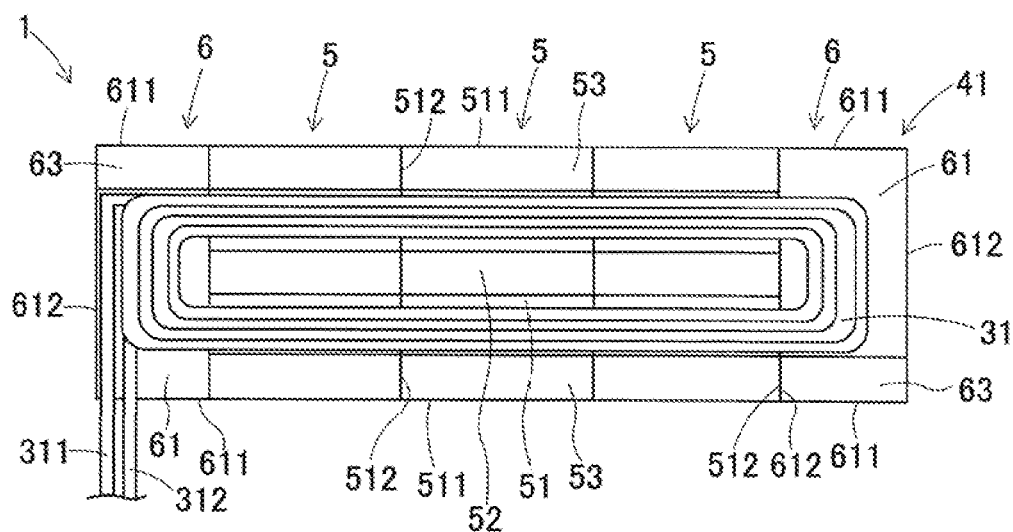
FIG. 2 is a front view of a non-contact power feeding coil of a first embodiment.
Figure 3:
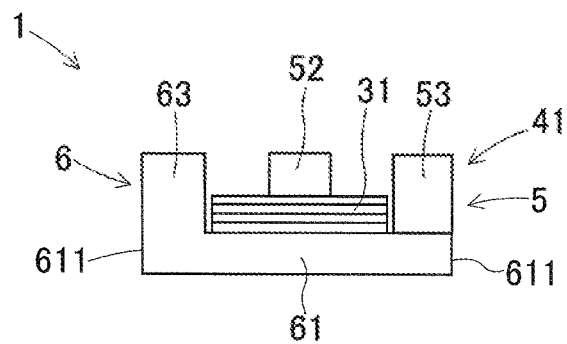
FIG. 3 is a side view of the non-contact power feeding coil of the first embodiment viewed from a right side in FIG. 2.

FIG. 2 is a front view of the non-contact power feeding coil 1 of the first embodiment, and FIG. 3 is a side view of the non-contact power feeding coil 1 of the first embodiment viewed from a right side in FIG. 2. The non-contact power feeding coil 1 is provided with a coil 31 and a core 41. The core 41 is configured by five core units connected in one row. The connection directions of the core units match in the movement direction of the moving body 94. The core units are made up of three central E-type cores 5 and two L-type cores 6 on both ends. The core 41 has an increased or reduced number of connections of the center E-type cores 5 according to the necessary power feeding capacity, size of an installation space, and the like.

The E-type core 5 is equivalent to the interlinked core unit, and is made up of a bottom section 51, a center leg section 52, and two side leg sections 53. The bottom section 51 is formed in a rectangular frame form. The two side leg sections 53 around which the coil 31 is not wound are erected from two short sides 511 of the bottom section 51, and are parallel to each other. The center leg section 52 around which the coil 31 is wound is erected from the center of the bottom section 51, and is parallel to the two side leg sections 53. Accordingly, the E-type core 5 is an E shape in a side view viewing a long side 512 of the bottom section 51.

As shown in FIG. 2, erection height dimensions of the center leg section 52 and the side leg sections 53 are equal to each other. Furthermore, a cross section that intersects with a magnetic path of the center leg section 52 and the side leg sections 53 is a rectangle with a fixed shape, and the sectional area is also fixed. In this arrangement, in the non-contact power feeding system 9 of the embodiment, two E-type cores 5 face each other and jointly form a circulating magnetic path. Therefore, the prior art of PTL 1 to PTL3 is different, and it is not necessary to narrow the separation distance between tip ends of the center leg section 52 and the side leg sections 53. In addition, the sectional areas of the center leg section 52 and the side leg sections 53 are equal to each other, but the sectional area of the center leg section 52 may be larger than the sectional area of the side leg sections 53.

An L-type core 6 is equivalent to the non-interlinked core unit, and is configured of a bottom section 61 and one side leg section 63. A short side 611 of the rectangular frame form bottom section 61 is shorter than the short side 511 of the bottom section 51 of the E-type core 5. Meanwhile, a long side 612 of the bottom section 61 is the same length as the long side 512 of the bottom section 51 of the E-type core 5. One side leg section 63 is erected from one short side 611 of the bottom section 61. Accordingly, the L-type core 6 is an L shape in a side view viewing a long side 612 of the bottom section 61. An erected height dimension of the side leg section 63 is the same height dimension as the side leg section 53 of the E-type core 5 as indicated in FIG. 2, or is less than or equal. A cross section of the side leg sections 63 is a rectangle with a fixed shape, and the sectional area is also fixed.

In connection of the E-type cores 5 to each other, the long sides 512 of the bottom sections 51 are connected to each other. Simultaneously, the center leg sections 52 are connected to each other and the side leg sections 53 are connected to each other. In addition, in connection of the E-type cores 5 and the L-type cores 6, the long sides 512 of the bottom sections 51 of the E-type cores 5 and the long sides 612 of the bottom section 61 of the L-type cores 6 are connected. Simultaneously, one side leg section 53 of the E-type core 5 and the side leg section 63 of the L-type core 6 are connected. The side leg sections 63 of the two L-type cores 6 are disposed in a diagonal position to each other such that the entirety of the core 41 is a rotational symmetrical form.

In the core 41 that is configured as described above, a slot is formed that has an elongated rectangular frame shape around three connected center leg sections 52. The coil 31 is disposed around the slot. The L-type core 6 is disposed facing the end portion of the coil 31, and the long side 612 on the outside of the L-type core 6 is disposed further to the outside than the coil 31. In other words, the coil 31 does not protrude from the core 41.

Lead lines 311 and 312 on both ends of the coil 31 pass through one L-type core 6, and are drawn out in a direction that is a right angle to the connection direction of the L-type core 6 on an opposite side of the side leg section 63. Thereby, it is possible to dispose the non-contact power feeding coil 1 over the entirety of the width direction dimension of each fixed section 91 to 93. If it is assumed that when the lead lines 311 and 312 are drawn out in the connection direction, the length in the connection direction of the non-contact power feeding coil 1 reduces by only the drawn out length.

Figure 4:
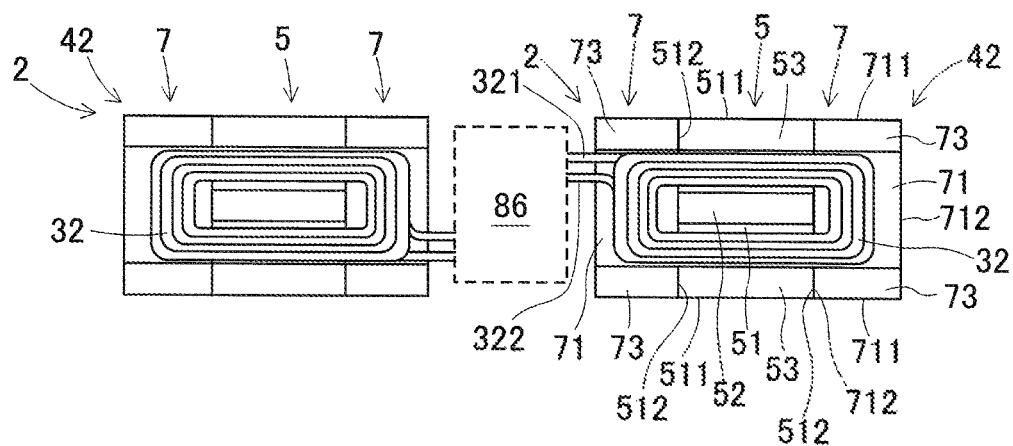
FIG. 4 is a front view illustrating two non-contact power feeding coils of a second embodiment disposed in a moving body.

2. Configuration of Non-contact Power Feeding Coil 2 of Second Embodiment FIG. 4 is a front view of two non-contact power feeding coils 2 of a second embodiment disposed in a moving body 94. The non-contact power feeding coil 2 is provided with a coil 32 and a core 42. The core 42 is configured by three core units connected in one row. The connection directions of the core units match in the movement direction of the moving body 94. The core units are made up of one central E-type core 5 and two C-type cores 7 on both ends. The core 42 has an increased or reduced number of connections of the center E-type cores 5 according to the necessary power feeding capacity, size of an installation space, and the like. The E-type cores 5 that are used in the non-contact power feeding coil 2 of the second embodiment is same product as the E-type core 5 that is used in the non-contact power feeding coil 1 of the first embodiment.

A C-type core 7 is equivalent to the non-interlinked core unit, and is configured of a bottom section 71 and two side leg sections 73. A short side 711 of the rectangular frame form bottom section 71 is shorter than the short side 511 of the bottom section 51 of the E-type core 5. Meanwhile, a long side 712 of the bottom section 71 is the same length as the long side 512 of the bottom section 51 of the E-type core 5. The two side leg sections 73 are erected from two short sides 711 of the bottom section 71, and are parallel to each other. Accordingly, the C-type core 7 is a C shape (U shape) in a side view viewing a long side 712 of the bottom section 71. An erected height dimension of the side leg section 73 is the same height dimension as the side leg section 53 of the E-type core 5, or is less than or equal. A cross section of the side leg sections 73 is a rectangle with a fixed shape, and the sectional area is also fixed.

In connection of the E-type cores 5 and the C-type cores 7, the long sides 512 of the bottom sections 51 of the E-type cores 5 and the long sides 712 of the bottom section 71 of the C-type cores 7 are connected. Simultaneously, two side leg sections 53 of the E-type core 5 and two side leg sections 73 of the C-type core 7 are respectively connected.

In the core 42 that is configured as described above, a slot is formed that has a rectangular frame shape around the center leg section 52. The coil 32 is disposed around the slot. The C-type core 7 is disposed facing the end portion of the coil 32, and the long side 712 on the outside of the C-type core 7 is disposed further to the outside than the coil 32. In other words, the coil 32 does not protrude from the core 42.

In addition, lead lines 321 and 322 on both ends of the coil 32 pass through one C-type core 7, and are drawn outward in the connection direction of the C-type core 7. However, the lead lines 321 and 322 of the two non-contact power feeding coils 2 are drawn out to approach each other. Thereby, on the moving body 94, it is possible to shorten a wiring length that connects the two non-contact power feeding coils 2 and the power receiving circuit 86.

Figure 5:
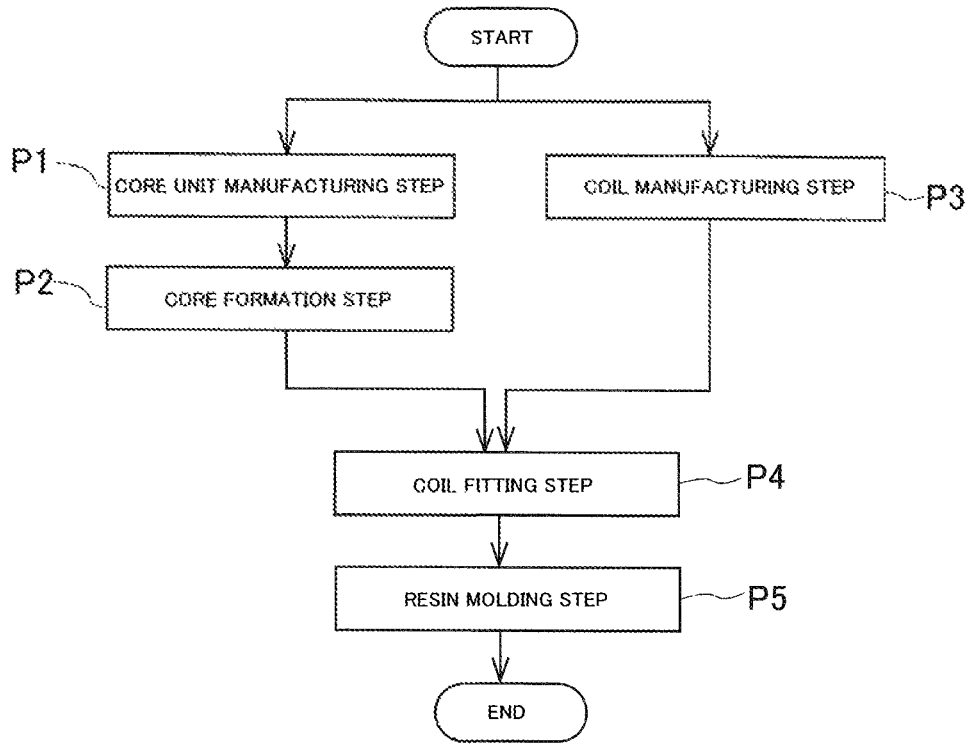
FIG. 5 is a diagram of a manufacturing step that describes a manufacturing method of the non-contact power feeding coil of the first and second embodiments.

3. Manufacturing Method of Non-Contact Power Feeding Coils 1, 2 of First and Second Embodiments FIG. 5 is a diagram of a manufacturing step that describes a manufacturing method of the non-contact power feeding coils 1 and 2 of the first and second embodiments. As illustrated, a manufacturing step includes a core unit manufacturing step P1, a core formation step P2, a coil manufacturing step P3, a coil fitting step P4, and a resin molding step P5.

In the core unit manufacturing step P1, magnetic particles such as ferrite particles are sintered using three types of molds, and the E-type core 5, the L-type core 6, and the C-type core 7 are manufactured. As described above, it is possible to change in stages the size of the cores 41 and 42 by increasing and reducing the number of connections of the E-type core 5. Accordingly, the size of the non-contact power feeding coils 1 and 2 are changed, and only three types of molds may be prepared without it being necessary to newly manufacture the molds.

In the core formation step P2, three or more core units (E-type core 5, L-type core 6, and C-type core 7) are connected in one row and form the cores 41 and 42. As the connection method, it is possible to exemplify adhesion, welding, joint fastening with a binding member, and the like, and the method is not limited thereto.

In the coil manufacturing step P3, the cores 41 and 42 manufacture the coils 31 and 32 by separately winding the wiring. At this time, winding work is performed using a wrapping core that is equivalent to the size of the three center leg sections 52 or the size of one center leg section 52, and a winding core is removed after manufacture of the coils 31 and 32. The thickness and the material of the wring that is used, the number of windings, and the like are designed, as appropriate, according to the required power feeding capacity and the like. It is possible for the coil manufacturing step P3 to proceed in parallel with the core unit manufacturing step P1 and the core formation step P2.

In the coil fitting step P4, the coils 31 and 32 are fitted in a slot around the center leg section 52. At this time, since the cross section of the center leg section 52 is rectangle with a fixed shape, fitting work is easy. In the resin molding step P5, the surface of the coils 31 and 32 and the cores 41 and 42 are molded using resin. Thereby, weatherproofing performance and durability improve while electrical insulation performance is stabilized.

4. Actions of Non-Contact Power Feeding Coils 1, 2 of First and Second Embodiments In the non-contact power feeding system 9, the non-contact power feeding coil 1 of the first embodiment and the non-contact power feeding coil 2 of the second embodiment are disposed to face each other while relatively moving. At this time, the center leg sections 52 of both coils 1 and 2 face each other with a slight separation distance, and the side leg sections 53 of both coils 1 and 2 face each other with a slight separation distance. Thereby, two E-type cores 5 that face both coils 1 and 2 jointly form a circulating magnetic path, and electromagnetic coupling with an extremely high coupling degree is realized.

Meanwhile, the L-type core 6 of the non-contact power feeding coil 1 and the C-type core 7 of the non-contact power feeding coil 2 pass only a slight magnetic flux, and contribution to electromagnetic coupling is small. However, in the L-type core 6 and the C-type core 7, the outer side long sides 612 and 712 are disposed further outward than the coils 31 and 32, and act to not cover the end portion of the coil 31 and protrude. Accordingly, the L-type core 6 and the C-type core 7 have a prominent magnetic shield effect that prevents leakage of magnetic flux to the outside that is generated by the coils 31 and 32 but does not pass the E-type core 5.

5. Modes and Effects of Non-Contact Power Feeding Coil 1, 2 of First and Second Embodiments The non-contact power feeding coils 1 and 2 of the first and second embodiments are provided with: coils 31 and 32; and cores 41 and 42 that forms a part of the circulating magnetic path that is interlinked to the coils 31 and 32, and are used in at least one of the fixed sections 91 to 93 (power feeding-side device) and the moving body 94 (power receiving-side device) of the non-contact power feeding system 9, in which the cores 41 and 42 are configured to connect three or more core units in one row, and the core units include one or more E-type cores 5 (interlinked core units) that are interlinked to the coil 31 and two L-type cores 6 or C-type cores 7 (non-interlinked core units) that are not interlinked to the coils 31 and 32 respectively disposed on both ends in the connection direction of the one or more E-type cores 5.

Thereby, the L-type cores 6 and the C-type cores 7 that are disposed on both ends in a connection direction are disposed facing the end portion of the coils 31 and 32. Then, the L-type cores 6 and the C-type cores 7 have a magnetic shield effect of a contribution to electromagnetic coupling is reduced and magnetic flux that is generated by the coils 31 and 32 does not leak to the outside. Accordingly, it is possible to provide the non-contact power feeding coils 1 and 2 that suppresses an increase of leakage flux.

In addition, it is possible to easily change the size of the non-contact power feeding coils 1 and 2 by increasing and reducing the number of connections of the E-type cores 5 that are disposed in the center of the cores 41 and 42. Thereby, it is possible to correspond to a change of power feeding capacity and it is possible to correspond to a difference of the width direction dimension of the fixed sections 91 to 93 or a change of distances between the fixed sections 91 to 93. Additionally, since it is not necessary to newly manufacture a mold every time the size of the non-contact power feeding coils 1 and 2 is changed, costs are reduced.

Furthermore, the interlinked core units are E-shaped E-type cores 5 having the center leg section 52 around which the coils 31 and 32 are wound and two side leg sections 53 around which the coils 31 and 32 are not wound in side view. Thereby, two facing E-type cores 5 jointly form the circulating magnetic path, and electromagnetic coupling with an extremely high coupling degree is realized.

Furthermore, the center leg section 52 of the E-type cores 5 has a fixed sectional shape that intersects with a circulating magnetic path, and has the coils 31 and 32 fitted thereto. Thereby, the cores 41 and 42 are manufactured separately from the coils 31 and 32, and are able to be fitted to the center leg section 52. Accordingly, compared with the prior art, the manufacturing method of the non-contact power feeding coils 1 and 2 is extremely easy.

Furthermore, the non-interlinked core units have L-shaped L-type cores 6 having one side leg section 63 in side face view or have C-shaped C-type cores 7 having two side leg sections 73 inside view. Thereby, it is possible to configure such that the long sides 612 and 712 on the outer side of the L-type cores 6 and C-type cores 7 are disposed further outward than the coils 31 and 32, and the coils 31 and 32 do not protrude from the cores 41 and 42. Accordingly, the magnetic shield effect of the L-type cores 6 and C-type cores 7 is prominent and raising of leakage flux is substantially suppressed.

Figure 6:
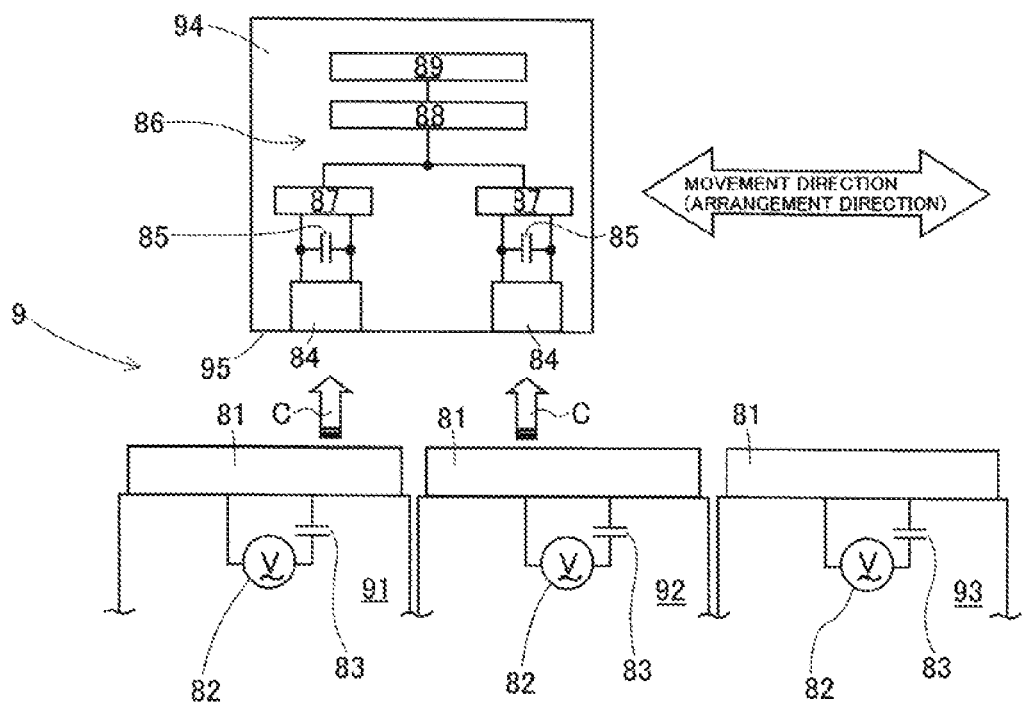
FIG. 6 is a diagram that describes a detailed configuration of a non-contact power feeding system of an embodiment.

6. Detailed Configuration of Non-Contact Power Feeding System 9 of Embodiment Next a detailed configuration of the non-contact power feeding system 9 of the embodiment will be described. FIG. 6 is a diagram that describes a detailed configuration of a non-contact power feeding system 9 of the embodiment. In the non-contact power feeding system 9 of the embodiment, the power feeding-side device is a board production line on which multiple board production machines are arranged. That is, each fixed section 91 to 93 is a board production machine of a component mounting machine and the like. Each fixed section 91 to 93 is able to be changed in order of arrangement position and switched with another fixed section, furthermore, it is also possible to extend the fixed section that lengthens the board production line. The moving body 94 that is equivalent to the power receiving-side device carries in machinery or members used by each fixed section 91 to 93 (board production machine) from a storage container which is omitted from the drawings, and is responsible for returning the machinery and members after use to the storage container.

The non-contact power feeding system 9 is configured by the power feeding-side coil 81, the power supply section 82, and a power feeding-side capacitor 83 that are respectively provided in each fixed section 91 to 93, and two power receiving-side coils 84, two power receiving-side capacitors 85, the power receiving circuit 86, and the like that are provided in the moving body 94. As described above, the non-contact power feeding coil 1 of the first embodiment is used as the power feeding-side coil 81, and the non-contact power feeding coil 2 of the second embodiment is used as the power receiving-side coil 84.

Each fixed section 91 to 93 has the same configuration which relates to the non-contact power feeding system 9 in the fixed section for switching and for extension. The power supply section 82 supplies power to the power feeding-side coil 81. A total of three power supply sections 82 of each fixed section 91 to 93 are able to operate independently from each other. It is possible to exemplify an AC power supply, a high-frequency power supply, a pulse power supply, a DC pulsation power supply, and the like as the power supply section 82. In the present embodiment, the power supply section 82 is an AC power supply, and for example, is configured using a DC power supply section that outputs DC voltage and a known bridge circuit that converts DC voltage to AC voltage. The power feeding-side coil 81 and the power feeding-side capacitor 83 are connected in series in an output terminal of the power supply section 82, and are configured by a closed power feeding circuit. The power feeding-side capacitor 83 forms a power feeding-side resonance circuit by connecting in series with the power feeding-side coil 81.

Two power receiving-side coils 84 are disposed separately from each other in the movement direction. As indicated by arrow C in FIG. 6, the power receiving-side coil 84 receives power by being electromagnetically coupled to the facing power feeding-side coil 81. Both ends of the power receiving-side coil 84 are connected in parallel to a rectifier circuit 87 that is configured by the power receiving-side capacitor 85 and the power receiving circuit 86. The power receiving-side capacitor 85 forms a power receiving-side resonance circuit by connecting in parallel with the power receiving-side coil 84.

The power receiving circuit 86 is configured to include the rectifier circuit 87 that is individually provided in two power receiving-side coils 84, and a DC power supply circuit 88 that is commonly provided in two power receiving-side coils 84. For example, the rectifier circuit 87 is configured by a full-wave rectifier circuit and a smoothing capacitor that are connected to bridge four rectifier diodes. Two rectifier circuits 87 are connected in parallel to the DC power supply circuit 88. Two rectifier circuits 87 convert to DC voltage power received by the power receiving-side coils 84 that are respectively connected to the input side by non-contact power feeding, and output the result to the DC power supply circuit 88. The DC power supply circuit 88 adjusts DC voltage of uncertain voltage value that is output from the rectifier circuit 87 to a DC drive voltage of substantially constant voltage, and the result is output to the electric load 89 that is installed on the moving body 94.

7. Modes and Effects of Non-contact Power Feeding System 9 of Embodiment

The non-contact power feeding system 9 of the embodiment uses the non-contact power feeding coil 1 of the first embodiment in the power feeding-side coil 81 and uses the non-contact power feeding coil 2 of the second embodiment in the power receiving-side coils 84, and the non-contact power feeding system 9 of the embodiment is provided with the multiple power feeding-side coils 81 that are disposed separately from each other along the movement direction that is set in the fixed sections 91 to 93 (power feeding-side device), the power supply section 82 that supplies power to each of the power feeding-side coils 81, the power receiving-side coil 84, which is provided in the moving body 94 that moves in the movement direction, and that receives power in a non-contact manner electromagnetically coupled with the power feeding-side coil 81 to be disposed facing the power feeding-side coil 81, and the power receiving circuit 86 that converts power that is received by the power receiving-side coil 84 and that generates a drive voltage and outputs to the electric load 89 that is provided to the moving body 94.

Thereby, when the power feeding-side coil 81 and the power receiving-side coil 84 are disposed to face each other, leakage flux remarkably reduces since the cores 41 and 42 of both coils 81 and 84 jointly form the circulating magnetic path, and electromagnetic coupling with an extremely high coupling degree is realized. Accordingly, it is possible to provide a non-contact power feeding system 9 in which favorable power feeding efficiency is obtained.

Furthermore, in the power feeding-side coil 81 (non-contact power feeding coil 1) and the power receiving-side coil 84 (non-contact power feeding coil 2), the E-type cores 5 that configure the cores 41 and 42 are the same products as each other. Thereby, since it is possible to make E-type core 5 molds that are used in the power feeding-side coil 81 and the power receiving-side coil 84 common, costs are prominently reduced.

Furthermore, the non-contact power feeding coil 1 that is drawn out in a direction that is a right angle to the connection direction of the lead lines 311 and 312 of the coil 31 is used in the power feeding-side coil 81. Thereby, it is possible to easily secure facing dispositions of the power feeding-side coil 81 and the power receiving-side coil 84 since it is possible to dispose the power feeding-side coil 81 over the entirety of the width direction dimension of each fixed section 91 to 93.

Furthermore, the non-contact power feeding coil 2 that is drawn outward in the connection direction of the lead lines 321 and 322 of the coil 32 is used in the power receiving-side coils 84, and the lead lines 321 and 322 of the two power receiving-side coils 84 are drawn out to approach each other. Thereby, on the moving body 94, it is possible to shorten a wiring length that connects the two power receiving-side coils 84 and the power receiving circuit 86.

Furthermore, the power feeding-side device is a board production line on which multiple board production machines are arranged, and the power receiving-side device is the moving body 94 that moves in the movement direction along the board production line. Thereby, even if a change of arrangement order of the fixed sections 91 to 93 (board production machine) in the board production line, switching to another fixed section, expansion of the fixed sections, and the like are performed, favorable power feeding efficiency of the non-contact power feeding system 9 is maintained. In addition, setup changing work of the fixed sections 91 to 93 is simplified.

8. Applications and Modifications of Embodiment

Note that, in the non-contact power feeding coils 1 and 2 of the first and second embodiments, one non-interlinked core unit that is disposed at both ends in the arrangement direction may be an L-type core 6, and the other may be a C-type core 7. In addition, in the manufacturing method of the non-contact power feeding coils 1 and 2 of the first and second embodiments, the coil manufacturing step P3 may be performed subsequently to the core formation step P2, and the wiring may be directly wound on the center leg section 52. In this case, the coil fitting step P4 becomes unnecessary.

Furthermore, in the non-contact power feeding system 9 of the embodiment, it is also possible to dispose the power feeding-side coils 81 lined up in pairs on the front face in the movement direction of each fixed section 91 to 93. In this case, the power supply section 82 supplies power to both ends that electrically connect the two power feeding-side coils 81 in series or in parallel. Meanwhile, the power receiving-side coils 84 on the moving body 94 side are not limited to two, and it is possible to set one or three or more. Various other applications and modifications of the present disclosure are possible.

INDUSTRIAL APPLICABILITY

The non-contact power feeding coil of the present disclosure is also usable in a system configuration other than the non-contact power feeding system 9 of the embodiment. In addition, the usage target is not limited to a board production line, and it is possible to use in a wide range of fields including assembly lines and processing lines that produce other products, power feeding during running of electric vehicles, and the like.

REFERENCE SIGNS LIST

1, 2: non-contact power feeding coil, 31, 32: coil, 311, 312, 321, 322: lead line, 41, 42: core, 5: E-type core (interlinked core unit), 52: center leg section, 53: side leg section, 6: L-type core (non-interlinked core unit), 63: side leg section, 7: C-type core (non-interlinked core unit), 73: side leg section, 81: power feeding-side coil, 82: power supply section, 84: power receiving-side coil, 86: power receiving circuit, 9: non-contact power feeding system, 91 to 93: fixed section, 94: moving body

The invention claimed is:

1. A non-contact power feeding coil, comprising:
   a coil; and
   a core that forms a part of a circulating magnetic path that is interlinked to the coil, wherein
   the core includes a plurality of core units connected in a row,
   the core units include at least one interlinked core unit interlinked to the coil, and two non-interlinked core units that are not interlinked to the coil respectively disposed on opposite ends of the core in a connection direction of the core units, and
   the two non-interlinked core units each have an L-shape and include a side leg section and a bottom section that extends from the side leg section in a direction perpendicular to the connection direction, the side leg section having a height greater than the bottom section.

2. The non-contact power feeding coil according to claim 1,
   wherein the at least one interlinked core unit has an E-shape and includes a center leg section around which the coil is wound and two side leg sections around which the coil is not wound in side view.

3. The non-contact power feeding coil according to claim 2,
   wherein the center leg section of the E-type core has a fixed sectional shape that intersects with the circulating magnetic path, and the center leg section has the coil fitted thereto.

4. The non-contact power feeding coil according to claim 1,
   lead lines on both ends of the coil pass through at least one of the two non-interlinked core units, and are drawn out in the direction perpendicular to the connection direction over the bottom section on an opposite side of the side leg section.

5. A non-contact power feeding system comprising:
   a power feeding-side device including a plurality of the non-contact power feeding coils according to claim 1 disposed separately from each other along a movement direction;
   a power supply section that supplies power to each of the non-contact power feeding coils;
   a non-contact power receiving coil provided in a power receiving-side device that moves in the movement direction, and that receives power in a non-contact manner electromagnetically coupled with at least one of the non-contact power feeding coils; and
   a power receiving circuit that converts power that is received by the non-contact power receiving coil and that generates a drive voltage and outputs the drive voltage to an electric load that is provided to the power receiving-side device.

6. The non-contact power feeding system according to claim 5,
   wherein in the non-contact power receiving coil and the non-contact power feeding coils, the interlinked core unit and at least one of the non-interlinked core units are a same product.

7. The non-contact power feeding system according to claim 5,
   wherein the power feeding-side device is a board production line on which a plurality of board production machines are arranged, and the power receiving-side device is a moving body that moves in the movement direction along the board production line.

8. A non-contact power feeding system, comprising:
a power feeding-side device including a plurality of non-contact power feeding coils disposed separately from each other in a row and along a movement direction, each of the non-contact power feeding coils including a coil, and a core that forms a part of a circulating magnetic path interlinked the coil, the core including a plurality of core units connected in a row, and the core units include at least one interlinked core unit interlinked to the coil, and two non-interlinked core units that are not interlinked to the coil respectively disposed on opposite ends of the core in a connection direction of the core units;
a power supply section that supplies power to each of the non-contact power feeding coils;
a power receiving-side device that moves in the movement direction, and that includes two non-contact power receiving coils that receive power in a non-contact manner electromagnetically coupled with at least one of the non-contact power feeding coils respectively; and
a power receiving circuit that converts the power received by the non-contact power receiving coils and that generates a drive voltage and outputs the drive voltage to an electric load that is provided to the power receiving-side device,
wherein the two non-contact power receiving coils and the power receiving circuit are lined up in the row and in the movement direction.

* * * * *